(12) United States Patent
Hakovirta et al.

(10) Patent No.: US 6,572,937 B2
(45) Date of Patent: Jun. 3, 2003

(54) METHOD FOR PRODUCING FLUORINATED DIAMOND-LIKE CARBON FILMS

(75) Inventors: Marko J. Hakovirta, Geneva (CH); Michael A. Nastasi, Santa Fe, NM (US); Deok-Hyung Lee, Plano, TX (US); Xiao-Ming He, Midland, MI (US)

(73) Assignee: The Regents of the University of California, Los Alamos, NM (US)

( * ) Notice: Subject to any disclaimer, the term of this patent is extended or adjusted under 35 U.S.C. 154(b) by 0 days.

(21) Appl. No.: 09/728,791

(22) Filed: Nov. 30, 2000

(65) Prior Publication Data

US 2002/0098285 A1 Jul. 25, 2002

Related U.S. Application Data

(60) Provisional application No. 60/168,218, filed on Nov. 30, 1999.

(51) Int. Cl.[7] .............................................. C23C 16/22
(52) U.S. Cl. ............... 427/577; 427/249.7; 427/255.39; 427/906
(58) Field of Search ........................ 427/577, 902–906, 427/569, 248.1, 249.7, 255.39; 438/127

(56) References Cited

U.S. PATENT DOCUMENTS

| | | | | |
|---|---|---|---|---|
| 4,693,927 A | * | 9/1987 | Nishikawa et al. | 428/216 |
| 4,971,667 A | * | 11/1990 | Yamazaki et al. | 118/723 E |
| 6,002,418 A | * | 12/1999 | Yoneda et al. | 347/203 |

* cited by examiner

Primary Examiner—Timothy Meeks
Assistant Examiner—William Phillip Fletcher, III
(74) Attorney, Agent, or Firm—Samuel M. Freund; Samuel L. Borkowsky

(57) ABSTRACT

Fluorinated, diamond-like carbon (F-DLC) films are produced by a pulsed, glow-discharge plasma immersion ion processing procedure. The pulsed, glow-discharge plasma was generated at a pressure of 1 Pa from an acetylene ($C_2H_2$) and hexafluoroethane ($C_2F_6$) gas mixture, and the fluorinated, diamond-like carbon films were deposited on silicon <100>substrates. The film hardness and wear resistance were found to be strongly dependent on the fluorine content incorporated into the coatings. The hardness of the F-DLC films was found to decrease considerably when the fluorine content in the coatings reached about 20%. The contact angle of water on the F-DLC coatings was found to increase with increasing film fluorine content and to saturate at a level characteristic of polytetrafluoroethylene.

2 Claims, 4 Drawing Sheets

METHOD FOR PRODUCING FLUORINATED DIAMOND-LIKE CARBON FILMS

RELATED APPLICATIONS

This application claims the benefit of provisional application 60/168,218, filed Nov. 30, 1999.

STATEMENT REGARDING FEDERAL RIGHTS

This invention was made with government support under Contract No. W-7405-ENG-36 awarded by the U.S. Department of Energy to The Regents of The University of California. The government has certain rights in the invention.

FIELD OF THE INVENTION

The present invention relates generally to the deposition of diamond-like coatings on substrates and, more particularly, to the deposition of fluorinated diamond-like coatings on substrates using plasma immersion ion processing.

BACKGROUND OF THE INVENTION

Diamond-like carbon (DLC) films are known for their high hardness, wear resistance and low friction. Many applications have been developed for these coatings and their modified counterparts. A scratch resistant and extremely hard coating with excellent hydrophobic (un-wetting) properties has numerous practical applications ranging from non-stick kitchenware to protective coatings for optics. Since DLC is itself only mildly hydrophobic, different elements such as F, N, O or Si, have often been incorporated into it by using a variety of techniques (see e.g., M. Grischke et al., Surf. Coat. Technol. 74, 739 (1995)). The fluorination of thin films and surfaces can be achieved using both etching and deposition treatments. However, the fluorine incorporation in surfaces after the widely used $C_2F_4$ plasma etching process is only a few nanometers deep (see, e.g., Y. Lin and L. J. Overzet, Appl. Phys. Left. 62, 675 (1993) and C. Vivensang et al., Diamond Relat. Mater. 3, 645 (1994)), thereby limiting the applications of the treated surfaces. The deposition of different types of fluorinated films such as fluoropolymer films by sputtering of polytetrafluoroethylene (PTFE) onto targets or by using plasma-assisted deposition has been well established (see, e.g., D. Fleisch et al., J. Membrane Sci. 73, 163 (1992) and F. Quaranta et al., Appl. Phys. Lett. 63, 10 (1993)). For the plasma deposition of F-DLC films fluorocarbon-hydrocarbon mixtures have been mostly used (see, e.g., D. Fleisch et al., J. Membrane Sci. 73, 163 (1992), R. S. Butter et al., Thin Solid Films, 107 (1997), and J. Seth and S. V. Babu, Thin Solid Films 230, 90 (1993)). The results from various studies by different groups have shown that the un-wetting properties of F-DLC films can reach the performance of PTFE and the hardness and wear resistance have been kept relatively high (see, e.g., M. Grischke et al., Diam. Relet. Mater. 7, 454 (1998) and C. Donnet et al., Surf. Coat. Technol. 94–95, 531 (1997)). Earlier studies have also shown that the contact angle behavior of the F-DLC films produced with plasma techniques from fluorocarbon-hydrocarbon gas mixtures depends on the incorporation of $CF_2$ and $CF_3$ groups rather than CF group (see, e.g., D. Fleisch et al., supra, H. Kasai et al., J. Phys. D19, L225 (1986), and J. Seth and S. V. Babu, supra). This incorporation then depends on the composition of source gases, deposition technique and parameters and plasma chemistry that take place during the deposition.

In order to attain widespread utilization, a method for deposition of thin films must be readily scalable to a production scale. This also applies to F-DLC films. To date, all plasma deposition techniques that have been used to produce hard F-DLC with good un-wetting properties have been line-of-sight processes. Thus, complex-shaped objects are difficult to uniformly coat. Plasma Immersion Ion Processing (PIIP) for the deposition of F-DLC coatings differs from the Plasma Source Ion Implantation (PSII) process by employing a low pulsed-bias voltage, typically less than 10 kV, and enables the deposition of thin films on various substrate materials (see, e.g., K. C. Walter et al., Surf. Coat Technol. 93, 287 (1997) and S. M. Malik et al., J. Vac. Sci. Technol. A15, 2875 (1997)). Additionally, PIIP enables conformal deposition over large areas (see, e.g., J. R. Conrad et al., J. Appl. Phys. 62, 4591 (1987)).

Accordingly, it is an object of the present invention to provide a method for depositing fluorinated, diamond-like coatings on chosen substrates using a non-line-of-sight process.

Another object of the present invention is to provide a method for depositing fluorinated, diamond-like coatings on chosen substrates using plasma immersion ion processing.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

To achieve the foregoing and other objects, and in accordance with the purposes of the present invention, as embodied and broadly described herein, the method for depositing a fluorinated, diamond-like carbon coating on a selected substrates includes the steps of: applying a negative-pulsed bias to the substrate, and immersing the biased substrate in a plasma containing ions simultaneously bearing carbon and hydrogen and carbon and fluorine, whereby the ions are projected onto the surface of said substrate and form a fluorinated, diamond-like coating on the surface thereof.

Preferably, the plasma is formed in a gas mixture including acetylene and hexafluoroethane.

It is also preferred that the substrate includes silicon.

Benefits and advantages of the present invention include conformal deposition of fluorinated, diamond-like carbon coatings over large areas.

BRIEF DESCRIPTION OF THE DRAWINGS

The accompanying drawings, which are incorporated in and form a part of the specification, illustrate the embodiments of the present invention and, together with the description, serve to explain the principles of the invention. In the drawings.

DETAILED DESCRIPTION

Figure 1:
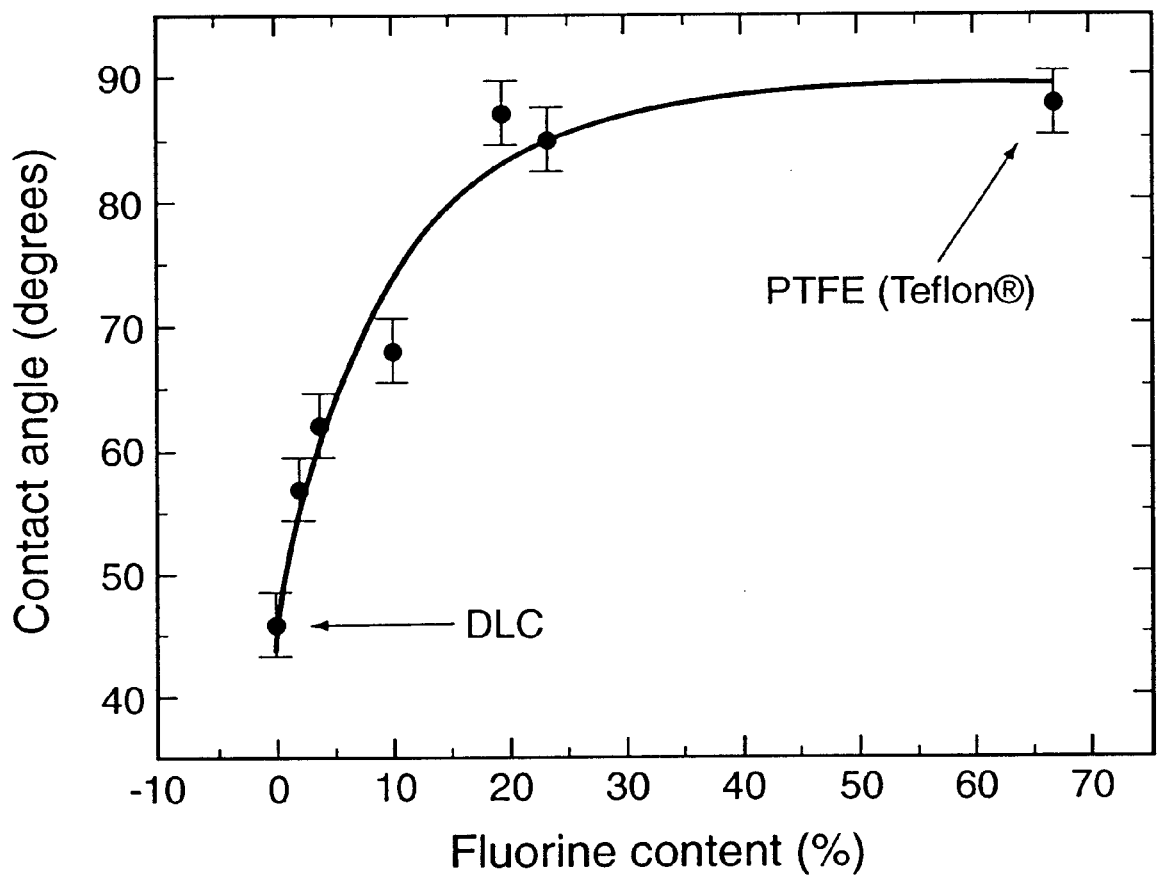
FIG. 1 is a graph showing the wetting angle against water as a function of the fluorine content (fluorine weight percent) of fluorinated, diamond-like coatings deposited on silicon substrates. Data for pure diamond-like coatings and Teflon are presented for comparison.

Briefly, the present invention includes a method for depositing durable fluorinated, diamond-like (F-DLC) coatings on chosen substrates using plasma immersion ion processing (PIIP). Gas mixture of hexafluoroethane ($C_2F_6$) and acetylene ($C_2H_2$) were used for generation of the pulsed, glow-discharge plasma. The composition, hardness, modulus and un-wetting properties of the F-DLC coatings were measured as a function of gas composition. A gas ratio of acetylene to hexafluoroethane of unity ($C_2H_2:C_2F_6=1$) was found to yield an optimized combination of good un-wetting properties and high coating hardness. At higher $C_2F_6$ concentrations, the hardness, modulus and wear resistance of the F-DLC coatings became less desirable, while the un-wetting properties of the films did not improve. This deterioration of diamond-like properties for F-DLC films deposited using higher $C_2F_6$ concentrations in the gas mixture can be attributed to the increased etching behavior of the fluorocarbon plasma. The deposition rate for F-DLC coatings was found reach a minimum value when a gas ratio of $C_2H_2: C_2F_6=\frac{1}{2}$ was employed, and with a gas ratio $C_2H_2:C_2F_6=\frac{1}{3}$, significant etching of the substrate was observed.

Having generally described the present invention, the following EXAMPLE provides greater detail as to the operation thereof.

EXAMPLE

To illustrate the method of the present invention, Si <100> was used as the substrate. Before deposition of the F-DLC, substrates were ultrasonically cleaned first in acetone, then in methanol, and subsequently sputter cleaned using an argon plasma. The initial pressure in the vacuum chamber was about $10^{-4}$ Pa. The argon plasma was generated using two inductively coupled 0.46 MHz RF power sources at about 0.04 Pa pressure (see, e.g., "Inductive Plasma Sources for Plasma Implantation and Deposition" by M. Tuszewski, et al., IEEE Transactions of Plasma Science 26, 1653 (1998), and "Diamond-Like Carbon Deposition on Silicon Using Radio-frequency Inductive Plasma of Ar and $C_2H_2$ Gas Mixture in Plasma Immersion Ion Deposition" by D. H. Lee et al., Appl. Phys. Lett. 73, 2423 (1998)). In order to generate a uniform ion distribution, both sources were positioned mirror-symmetrically with respect to the sample stage. The pulsed bias voltage during the sputter cleaning process was 1 kV, and the pulse frequency and pulse length were 10 kHz and 20 $\mu$s, respectively. The total sputtering time was 10 minutes for all substrates.

Pulsed glow discharge plasmas were used for the F-DLC depositions. Acetylene ($C_2H_2$) and hexafluoroethane ($C_2F_6$) gases were introduced into the chamber at various gas ratios, and a pulsed bias voltage of 4 kV was applied to the substrate. The pressure was maintained at approximately 1 Pa by adjusting the mass flow of the plasma gases. The pulse frequency was 4 kHz and the pulse length was 30 $\mu$s. The deposition rate was found to vary for different gas ratios. The following gas ratios were used for the deposition of the F-DLC coatings: $C_2H_2:C_2F_6$ (10:1), $C_2H_2:C_2F_6$ (5:1), $C_2H_2:C_2F_6$ (2:1), $C_2H_2:C_2F_6$ (1:1), $C_2H_2:C_2F_6$ (1:2) and $C_2H_2:C_2F_6$ (1:3). A Residual Gas Analyzer (RGA) was used to analyze the plasma composition.

The thickness of the coatings were measured using a profilometer and were found to vary between about 150 nm and 1.3 $\mu$m, while the roughness value of all coatings was about 10 nm. Hardness measurements were performed using a nanoindentor having a continuous stiffness mode. Hardness data were averaged for 10 indents and data from depths of about 10% of the total film thickness was selected. The compositions of the F-DLC films were measured using Rutherford Backscattering Spectrometry (RBS) and Elastic Recoil Detection (ERD) spectrometry with a 75° beam-incidence angle to the surface normal (see, e.g., Handbook of *Modern Ion Beam Materials Analysis*, edited by J. R. Tesmer and M. Nastasi, (MRS, Pittsburg, 1995), p. 37–139). Friction and wear measurements were performed using a conventional pin-on-disk measurement system having an optical wear rate measurement capability. Contact angle measurements were performed by applying droplets of distilled water on the coating surface using a pipette and recording the contact angle using a digital camera. Three droplet sizes were used and six different contact angle measurements were averaged. As a comparison, contact angles against water for other materials were measured. For PTFE (Teflon®) the contact angle was 88°, 46° for DLC (produced using the PIIP technique on neat $C_2H_2$ gas), and 24° for uncoated Si (<100>polished wafer). Before measurements were performed the samples were cleaned in an ultrasonic bath first with acetone and then with methanol.

Turning now to the drawings, FIG. 1 is a graph showing the wetting angle against water as a function of the fluorine content (fluorine weight percent) of fluorinated, diamond-like coatings deposited on silicon substrates. Data for pure diamond-like coatings and Teflon are presented for comparison. The unwetting properties improve exponentially, saturating at the level characteristic for PTFE (Teflon®). The data are shown in the TABLE which sets forth the composition, contact angle, hardness and modulus data as a function of $C_2H_2:C_2F_6$ gas ratio.

TABLE

| $C_2H_2:C_2F_6$ | Fluorine content | Hydrogen content | Contact angle (against water) | Hardness | Modulus | Friction coefficient (66.2 g, ruby-pin, 10% humidity) |
|---|---|---|---|---|---|---|
| 10:1 | 1.9% | 25.2% | 57° | 18 GPa | 140 Gpa | 0.13 |
| 5:1 | 3.7% | 20.2% | 62° | 18 GPa | 150 Gpa | 0.12 |
| 2:1 | 10.0% | 7.8% | 68° | 15 GPa | 130 Gpa | 0.15 |
| 1:1 | 19.7% | 3.1% | 87° | 8 GPa | 80 Gpa | 0.09 |
| 1:2 | 23.3% | 3.0% | 85° | 3 GPa | 30 Gpa | — |
| DLC | 0.00% | 30.5% | 46° | 18 GPa | 140 Gpa | 0.12 |
| Teflon ® | 67.0% | 0.0% | 88° | 0.8 | 1.9 | — |

Since the coating produced using the gas ratio $C_2H_2:C_2F_6=\frac{1}{2}$ was too soft for pin-on-disk measurements, friction data is not presented. A gas ratio of ⅓ did not produce a coating.

Figure 2:
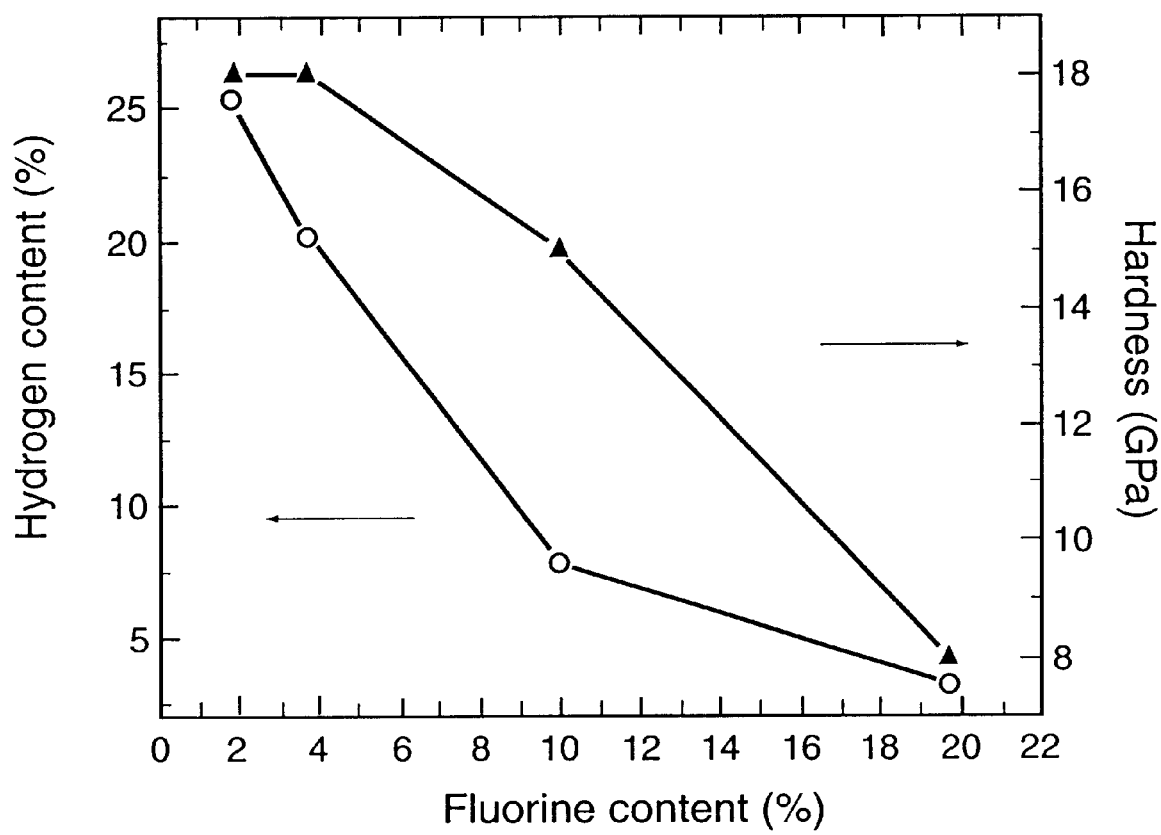
FIG. 2 is a graph showing the hydrogen content and hardness as a function of fluorine content (fluorine weigh percent) of fluorinated, diamond-like coatings deposited on silicon substrates.
Figure 3:
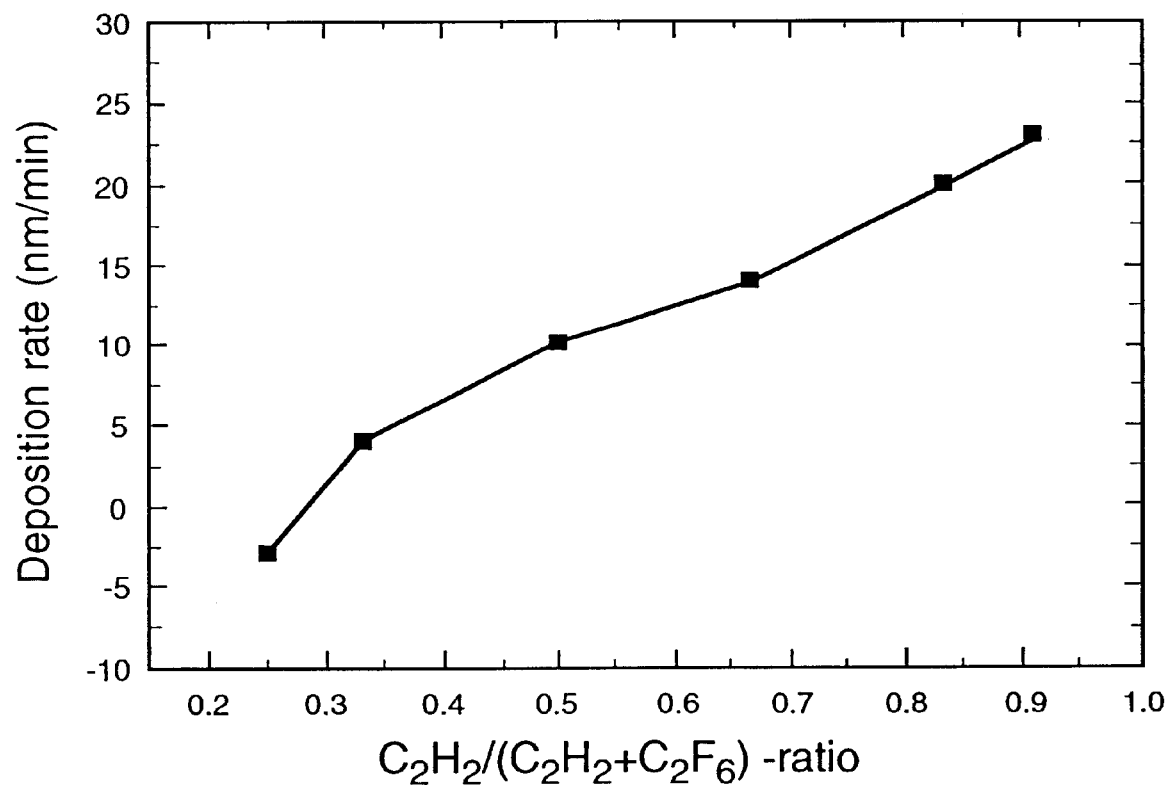
FIG. 3 is a graph showing the deposition rate of a fluorinated, diamond-like coating onto a silicon substrate as a function of $C_2H_2/(C_2F_6+C_2H_2)$ ratio in the plasma gas mixture.

FIG. 2 is a graph showing the hydrogen content and hardness as a function of fluorine content (fluorine weigh percent) of fluorinated, diamond-like coatings deposited on silicon substrates. It is seen that both the hydrogen content and hardness decrease with increasing fluorine concentration. FIG. 3 is a graph showing the deposition rate of a fluorinated, diamond-like coating onto a silicon substrate as a function of $C_2H_2/(C_2F_6+C_2H_2)$ ratio in the plasma gas mixture. The etching property of the fluorocarbon plasma becomes more dominant after a certain threshold in the gas composition, since the deposition rate of the F-DLC coating is seen to decrease with increasing $C_2F_6$ content in the gas mixture. This may explain the difference in the hardness for the coatings that were produced with gas ratio $C_2H_2:C_2F_6=1$ compared to coatings produced with ratio $C_2H_2:C_2F_6=\frac{1}{2}$. Thus, present inventors believe that the harsh etching on the film surface transforms the $sp^3$ bonding in the DLC bonding network into $sp^2$ bonding, which lowers the hardness and the modulus of the coating. As stated, at a gas ratio $C_2H_2:C_2F_6=\frac{1}{3}$, etching became dominant and no deposition occurred. The low hydrogen content in the deposited F-DLC coatings is likely explained by the lowered partial pressure of hydrogen in the $C_2H_2:C_2F_6$-gas mixtures employed.

Figure 4:
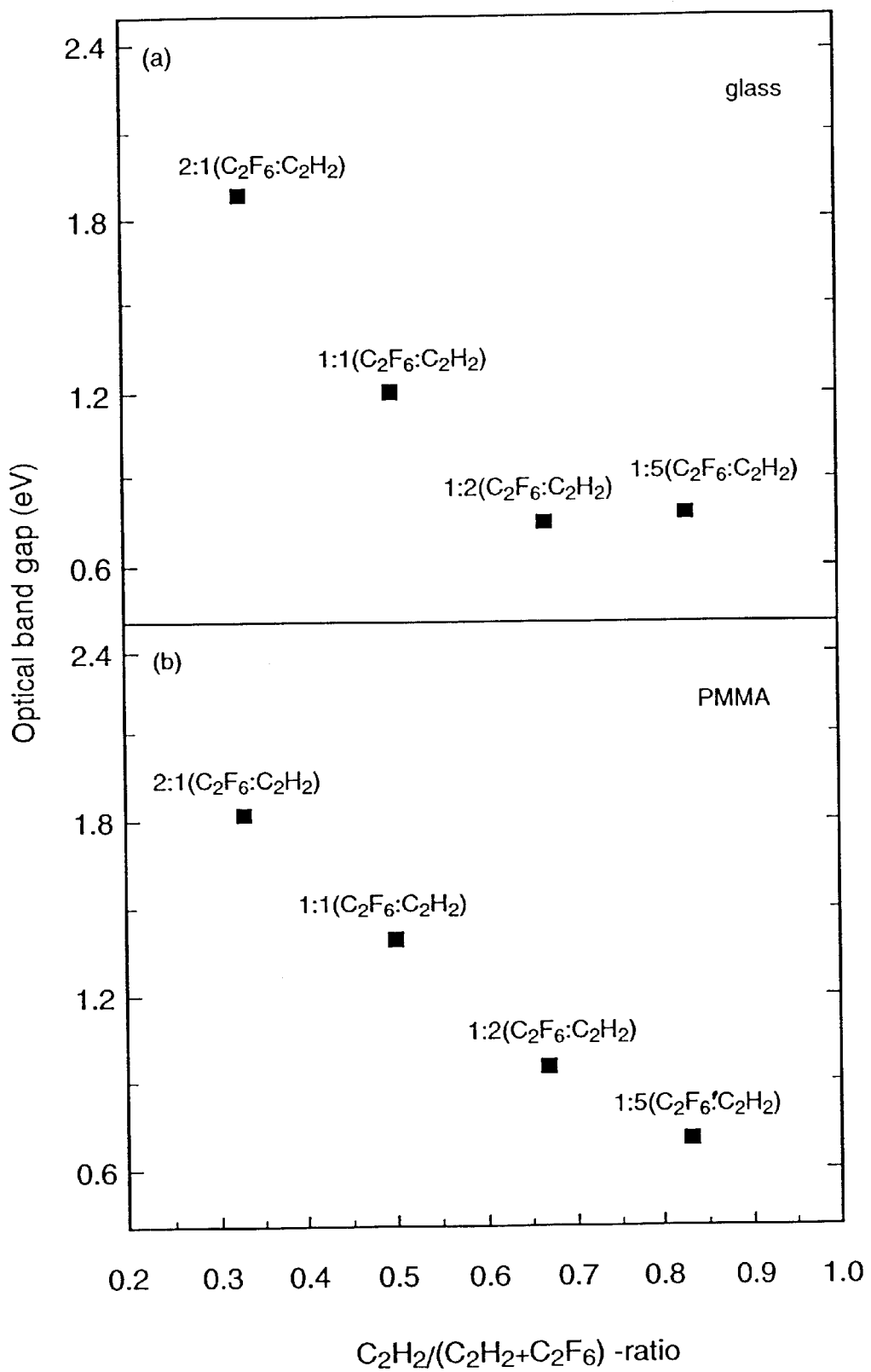
FIG. 4 shows the optical band gap for fluorinated diamond-like coatings on glass (a) and PMMA (b) generated using different $C_2F_6:C_2H_2$-gas ratios.

The calculated optical band gap, as a function of incorporated fluorine content in the films, is shown in FIG. 4 for F-DLC coatings on glass (a) and polymethylmethacrylate (PMMA) (b) generated using different $C_2F_6:C_2H_2$-gas ratios. Associating the hydrogen concentration in the Table with the data in FIG. 4, it is seen that increasing the fluorine content suppresses the incorporation of H and increases the optical band gap energy. This is different from the general a-C:H DLC films where optical properties are closely correlated to the amount of hydrogen incorporated in the films (See, e.g., J. Robertson, Surf. Coat. Technol. 50, 185 (1992)). The increase in the optical band gap energy may indicate that the incorporated fluorine in the DLC has modified the chemical structure of the film towards higher $sp^3$ bonding fraction.

The foregoing description of the invention has been presented for purposes of illustration and description and is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method for producing a fluorinated, diamond-like carbon coating on a substrate which comprises the steps of:

(a) applying a negative-pulsed bias to said substrate; and (b) immersing the biased substrate in a plasma containing ions simultaneously bearing carbon and hydrogen and carbon and fluorine, whereby the ions are projected onto the surface of said substrate and form a fluorinated, diamond-like coating on the surface thereof, wherein the plasma is formed in a gas mixture of acetylene and hexafluoroethane having a ratio of about 1:1.

2. The method for producing a fluorinated, diamond-like carbon coating on a substrate as described in claim 1, wherein said substrate includes silicon.

* * * * *